US007382887B2

(12) United States Patent
Brodkin

(10) Patent No.: US 7,382,887 B2
(45) Date of Patent: Jun. 3, 2008

(54) METHOD AND DEVICE FOR REDUCING HIGH FREQUENCY ERROR COMPONENTS OF A MULTI-CHANNEL MODULATOR

(75) Inventor: Panu Brodkin, Tampere (FI)

(73) Assignee: Nokia Corporation, Espoo (FI)

( * ) Notice: Subject to any disclaimer, the term of this patent is extended or adjusted under 35 U.S.C. 154(b) by 671 days.

(21) Appl. No.: 10/421,143

(22) Filed: Apr. 23, 2003

(65) Prior Publication Data

US 2003/0202664 A1 Oct. 30, 2003

(30) Foreign Application Priority Data

Apr. 25, 2002 (WO) ........................ PCT/IB02/01379

(51) Int. Cl.

| | |
|---|---|
| ***H04B 15/00*** | (2006.01) |
| ***H03F 1/26*** | (2006.01) |
| ***H03F 1/30*** | (2006.01) |
| ***H03F 1/04*** | (2006.01) |
| ***H03F 1/34*** | (2006.01) |
| ***H03F 3/217*** | (2006.01) |
| ***H03C 1/02*** | (2006.01) |

(52) U.S. Cl. ....................... 381/94.1; 381/13; 381/94.7; 381/94.8; 332/159; 332/160; 332/161; 332/162; 330/149; 330/207 A

(58) Field of Classification Search ................ 332/159, 332/160–162, 109; 381/106, 94.7, 94.8, 381/13, 94.1, 1, 116–117, 94.6, 120, 111; 455/312, 303, 114.2; 330/10, 251, 207 A, 330/149

See application file for complete search history.

(56) References Cited

U.S. PATENT DOCUMENTS

| | | | | |
|---|---|---|---|---|
| 3,989,897 | A | 11/1976 | Carver | |
| 4,208,547 | A | 6/1980 | Simeau | |
| 5,826,181 | A * | 10/1998 | Reed | 455/312 |
| 5,963,589 | A | 10/1999 | Nagano et al. | |
| 6,181,796 | B1 * | 1/2001 | Johnson | 381/28 |
| 6,285,754 | B1 * | 9/2001 | Sun et al. | 379/399.02 |
| 6,297,693 | B1 * | 10/2001 | Pullen | 330/10 |

FOREIGN PATENT DOCUMENTS

| | | |
|---|---|---|
| EP | 0629054 | 12/1994 |
| WO | 9721211 | 6/1997 |

* cited by examiner

*Primary Examiner*—Vivian Chin
*Assistant Examiner*—Douglas Suthers
(74) *Attorney, Agent, or Firm*—Alfred A. Fressola; Ware, Fressola, Van Der Sluys & Adolphson, LLP

(57) ABSTRACT

A method and device for reducing error components of a multi-channel modulator. The method comprises the steps of inverting substantially half of the channels of a modulator, and reducing error components between said inverted channels and said non inverted channels by inductive and/or capacitive summing. The method is especially suitable for synchronized pulses and similar signals to be modulated.

23 Claims, 5 Drawing Sheets

METHOD AND DEVICE FOR REDUCING HIGH FREQUENCY ERROR COMPONENTS OF A MULTI-CHANNEL MODULATOR

CROSS-REFERENCE TO RELATED APPLICATIONS

This application claims priority under 35 USC §119 to International Patent Application No. PCT/IB02/01379, having an international filing date of Apr. 25, 2002.

TECHNICAL FIELD

The present invention relates to multi-channel audio amplifiers and more particular to noise reduction of those with a minimized use of large filters and coils.

BACKGROUND OF THE INVENTION

Pulse modulated audio amplifiers are based on a switching principle which minimizes the power losses. The output transistor is only on or off—and does not work resistively like in traditional class amplifiers. Such switching causes high frequency energy and electromagnetic compatibility (EMC) problems to the output signals. There is high frequency energy because of a modulated square wave with a high carrier frequency. The high frequency energy is primarily in the carrier frequency and its harmonics.

Low pass filtering can be used to prevent unwanted energy going into the speaker which may damage it. The size of filtering can be minimized by using ternary modulation e.g. pseudo-differential or class-BD modulation where all idle switching is of the common mode type. High frequency energy causes EMC problems and the common mode noise is especially difficult to filter out. Common mode noise is a problem for example with a headset wire between the device and the earphones, wherein the headset wire acts as an antenna. This common mode noise can be filtered with relatively large filters (coils). The difficulties in the filtering have limited the commercial use in small and lightweight mobile electronic devices.

SUMMARY OF THE INVENTION

It is desirable to have a device and a method for multi-channel devices capable of reducing common mode noise with a minimum effort.

It is further desirable to have an amplifier which is capable of reducing common mode noise and other electromagnetic interference (EMI) with a minimum effort.

According to one embodiment of the invention a method is provided to reduce EMI from the output signals of a multi-channel modulator with at least two channels of substantially similar signals in a portable device. The method is executed by modulating said substantially similar signals, inverting at least one, but equal to or less than half of said modulated signals, and summing said inverted signals and said non inverted signals to reduce error components in the signals.

If e.g. substantially similar signals are modulated with e.g. the same modulation signal, this leads to substantially the same errors in the output of the channels of the modulator. By inverting half of the output channel signals the noise components are inverted with the same phase in both channels. By summing said inverted modulated signal and said non inverted modulated signal by means of a summing means, it is possible to subtract the noise components of the same phase from the inverted and the not inverted channel from each other, by simply adding. The summing of the signals can be e.g. executed by filtering or short circuiting said frequencies the errors occur in. The method is especially suitable for synchronized pulses and similar input signals on both channels.

It is to be noted that the kind of modulation used is not important for the present invention. The basic idea of the invention is, if a multi-channel modulator or amplifier has substantially similar input signals, that high frequency interference occurring in both channels would be substantially the same, and therefore would be easily to be summed out, or filtered out differentially. Therefore, the used modulation can be e.g. amplitude modulation (AM), frequency modulation (FM), click modulation in a digital pulse modulation amplifier (DPMA), pulse width modulation (PWM), phase shift modulation (PSM), or any other modulation type generating high frequency error energy. AM, FM, PWM, PSM, and the like can be used in different combinations for each channel. The modulation can be executed in a fully analogue form, fully digitally or a hybrid type of analogue and digital modulation. The output of a fully digital modulator has only two different states: "high" and "low", which can be represented by two different voltages. The output of a fully analogue modulator can have any voltage values between a maximum and a minimum value. A hybrid modulation e.g. a three- or more level modulation can be used, wherein the output of the modulator switches between different determined voltage levels.

It is to be noted that the summing means can be a high pass filter and can also be a band-pass filter, wherein the band pass filter is selected in a way that the noise spectrum and not the signal spectrum can be short circuited by said filter.

Preferably, the method further comprises synchronizing said signals, preferably prior to inputting the channels into the multi-channel pulse width modulator. The synchronization is used to obtain synchronous pulse width modulation signals. By synchronously modulating the different channels, the phase of noise components is the same with high probability, especially in the case of multi-channel audio signals, e.g. stereo or other multi-channel with even number of channels. The audio signals in the different channels are substantially similar and use substantially the same depth of modulation in both (stereo) channels.

By inverting half of the output signals the noise components are inverted with the same phase. In the case of zero modulation (no input signal present) the output of the inverted and non-inverted channels are mirror images of each other. In case of 100% modulation, the negative and positive output of the same channel are mirror images of each other. When generated synchronously, the interference is also generated in phase.

By summing said inverted modulated signal and said non inverted modulated signal by means of a summing device, it is possible to subtract the noise components of the same phase from the inverted and the not inverted channel from each other. In the case of stereo, the sum of all four signals (Ch1+/Ch1−, Ch2+/Ch2−) is substantially small when the signaling (modulation) of one output is inverted with respect to the other channel. This method reduces the need for large filters for EMI filtering and thus enables the use of e.g. pulse width modulation amplifiers in small portable devices.

Advantageously, said summing is executed by inductive summing. Inductive summing can be executed by using a differential inductor. A differential inductor can be implemented as two coils connected by a core, so that e.g. counter phase signals can be filtered out, as they see the double impedance of a single coil, and for the same phase signals the impedance of both coils equal each other out.

Conveniently, said summing is executed by capacitive summing. Capacitive summing can be executed by shorting the channels with a capacitor, or a combination of coils and capacitors such a lowpass- and bandpass-filters.

Preferably, said summing is executed by means of one or more inductive summing means and/or capacitive summing means comprising filter elements selected from the group comprising coils, differential mode inductors, resistors and capacitors. A high pass filter can be used to short high frequencies between the different channels. The coils can be used as low pass filters to block high frequencies in the output of the modulation device. The capacitors can be used as high pass filters to short high frequencies from one channel to the other channel in the output of the modulation device. The capacitors and the coils can be used to build filters as high-, band-, and low pass filters according to an actual interference and noise signals. The differential mode inductor is a 4 pole combination of coils that are combined in a way that they act as a double impedance for currents in the same direction and as a zero impedance for currents in the opposite directions. This can be achieved e.g. by winding a coil with a double wire (wound on the bight).

It should be noted that the expression "high pass filter" is used to describe the connection between the inverted and non inverted channels. From the point of view of the high frequency interference, the filter acts as a high pass filter. From the point of view of the signal, the filter acts as a low pass filter.

Advantageously, said at least two signals comprise at least one pair of left and right channels of a stereo audio system. Conveniently, said at least two signals comprise the signals of a multi-channel surround audio system. An embodiment using a stereo signal has the advantage that the left and right audio signals are substantially similar and are therefore best suited for the summing operation in the method. The use of the multi-channel surround audio system is similar to the use of the stereo system with the difference that there may be an odd number of channels. So it is to be noted that the invention may only be applied to the half of the even channels, and not applied to the uneven e.g. center or bass channel.

Advantageously, said synchronization is executed by modulating synchronously. Synchronously modulating can be executed e.g. in the case of pulse width modulation (PWM) by comparing said two analogue input signals with a single comparison waveform. This is a classic case of pulse width modulation, where a comparator or a differential operational amplifier (op-amp) is used to compare the actual voltage of a signal with the actual voltage of a comparison waveform. For synchronous pulse width modulation, a single comparison waveform can be used for both op-amps. The comparison waveform is usually a periodic triangular or a saw-tooth like waveform or other wave. In the case of another modulation type, the same modulation waveform is used for the channels, to provide synchronously modulated signals.

Conveniently, the method further comprises pre-processing of the at least two substantially similar input signals prior to the step of synchronizing or modulating, by pre-processing the signals, e.g. by inverting the signal of one input channel, digitizing a signal or decoding audio data. It is to be noted that the synchronous pulse width modulation signals of the two different channel can be obtained not only from an analogue input signal but may be obtained from e.g. digitally coded audio data, e.g. from a CD or the like. In the case of digital data, the data signals for both channels can be pre-processed digitally, to convert e.g. a digital signal for a digital/analogue converter to a digital signal for a digital/PWM converter. The digital/PWM converter for each channel is to provide synchronized PWM output.

Preferably, the method further comprises amplifying said signals. One embodiment of the invention aims to amplify signals with a maximum efficiency. A PWM (pulse width modulation)—amplifier or PMA is known as one of the most effective type of amplifier. The summing may be executed prior and/or post to the amplification. It is to be noted that the PWM signals may be amplified in more than one stage. It is to be noted that the invention can be used with simple pulse width modulators, without the need to amplify. It is further to be noted that the amplification of the PWM signals may comprise an additional inversion so that the e.g. only between the PWM and the amplifier, or between two amplifiers the signals of half of the channels are inverted for summing. The amplification can be performed prior or posterior to inverting or summing.

Advantageously, the method further comprises demodulating said modulated signals. With the modulation, the amplification, the summing and the demodulation, all steps are provided to use the method for conventional amplification, wherein the output signal is substantially the amplified input signal.

According to another aspect of the present invention a multi-channel modulator (MCHM) having at least two channels is provided. The MCHM further has an inverting means, and at least one summing means. Said channels having each at least one input terminal, and at least one output terminal, said inverting means is linked to at least one, but less equal than half of said channels, and said summing means comprises being connected between said output terminals of said channels.

It should be noted that the expression "multi-channel" is used to clarify that the at least two input terminals are not dependent on each other, so that the MCHM can receive at least two (principally) independent signals on each of said at least two input terminals. The expression "input terminal" is used to describe the input portion for a channel, and may comprise one or more contacts or poles.

Preferably the multi-channel modulator comprises at least one pair of left and right channels of a stereo audio system.

Advantageously, the multi-channel modulator comprises at least the channels of a multi-channel surround audio system.

Advantageously, the multi-channel pulse width modulator further comprises a synchronization means connected between said channels.

The synchronization means is provided to synchronize the pules of the pulse width modulated signals, so that interference and noise generated during the modulation of the signals of the channels are generated with the same phase. Interference of both channels with the same phase can easily be filtered out.

Preferably, the MCHM further comprises at least one inverter connected to at least one of said output terminals, and said signal input terminals. The inverter may be economized, if one of the signals is inversely fed to the device. The inverter can be embodied as op-amps with an inverting output or as e.g. a H-Bridge (see FIGS. 2_a/b_) of one channel fed with an inverse voltage. In order to reduce common mode components half of the output channels are inverted, which requires an even number of channels for example stereo, quattro or the like. This also changes the polarity of inverted channels differential output which can be fixed simply by changing positive and negative terminals. It is to be noted, that the multi-channel PMA can comprise an uneven number of channels, as e.g. in the case of some surround sound amplifiers, wherein the "odd" channel e.g. the center bass channel, can not be supplied with a small filter according to the present invention and is therefore not inverted. Because audio (music etc.) signals contain mainly the same components in all channels with only small amount difference between channels, there are very similar signals in each channel. Therefore most of time pairs of signals with opposite phase between inverted and non-inverted signals exist. These pairs contain interference as differential mode energy, which can easily be summed out. According to one embodiment of the invention a device is provided to convert common mode EMI to differential mode EMI (can be summed out). As shown, the signals can be inverted in the modulator or in power stages of an amplifier with no extra effort.

Conveniently, said MCHM comprises at least one comparator or differential operational amplifier (op-amp) for each input terminal, to modulate said input signals by means of a modulation waveform. The at least one op-amp can be a single multi-channel op-amp or a number of op-amps e.g. one for each channel or one for each contact of a signal input terminal.

Advantageously, said MCHM further comprises a modulation waveform generator. The MCHM can receive the modulation waveform from an external or from an internal modulation waveform generator. In case of pulse width modulation, the modulation waveform would be the conventional comparison waveform.

Preferably, said summing means comprises at least one element selected from the group comprising resistors, coils, differential mode inductors, capacitors. Conveniently, said MCHM further comprises at least one element selected from the group comprising high-, band- and low-pass filters.

Preferably the MCHM further comprises at least one power amplifier. An amplifier connected between the output terminals of the MCHM can be used to amplify the signals from the modulator. The amplifier can be connected between the modulator and said summing means. A modulator with an amplifier can be used as a highly efficient amplifier. The output terminals of the amplifier can be connected to an additional summing means or with a high pass filter to suppress interference, a demodulator, e.g. a low pass filter to demodulate the modulated signal back to an analogue signal.

Advantageously the MCHM further comprises at least one pre-processing stage. The pre-processing stage can be used as described in the description of the method.

According to another aspect of the present invention a portable multi-channel electronic device having a built in multi-channel pulse width modulator is provided. The multi-channel width modulator of the device is embodied a described in the preceding description. Such a device is preferably a mobile electronic device as a mobile stereo music player or the like, which can be incorporated in other is mobile devices such as mobile telephones, potable computers and the like. Preferably, the portable multi-channel electronic device is a stereo or surround sound device.

Preferably the multi-channel electronic device further comprises headphones. Said headphones can be earphones, which can be fixedly or releasably connected to said multi-channel electronic device. So the device comprises at least one earphone socket. As described in the preceding description and in the following description of the figures, the electrical connection between the loudspeakers can differ from the standard. Standard earphones are usually connected with two signal lines (right and left) and a common ground (GND), wherein one embodiment of the earphones according to the present invention comprises two signal lines (e.g. right and inverted left) and a common ground, and wherein the (e.g.) left speaker is inversely connected between the common ground line and the inverted left line. It should be noted that the headphones can be standard stereo headphones, or surround sound headphones with more than one loudspeaker per earpiece.

The major advantage of the present invention is that bulky, fragile and expensive filtering components can be replaced by a much smaller more stable and cheaper solution.

BRIEF DESCRIPTION OF THE DRAWINGS

In the following, the invention will be described in detail by referring to the enclosed drawings in which.

DETAILED DESCRIPTION

Figure 1:
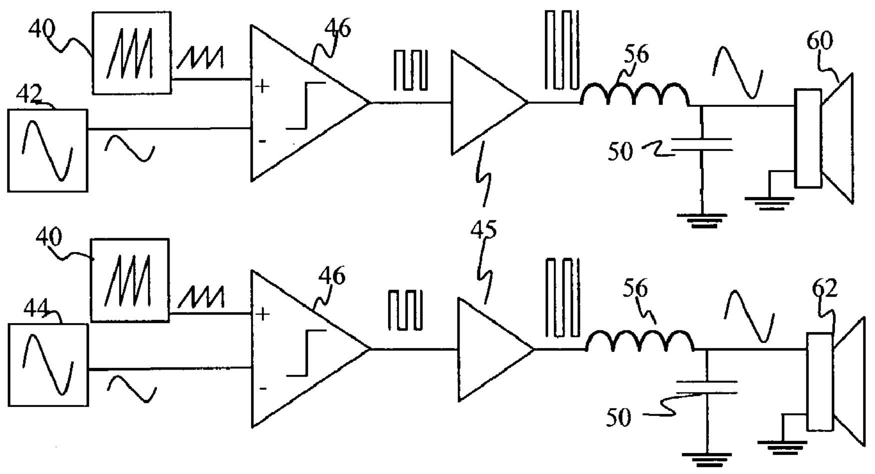
Fig. 1 (Prior Art)
FIG. 1 is a block diagram of a conventional two channel pulse width modulation amplifier (PMA), embodied as two parallel one channel amplifiers.

FIG. 1 is a block diagram of a conventional two-channel pulse width modulation amplifier (PMA), embodied as two parallel one-channel amplifiers. The single channels have two different input terminals or signal sources 42 and 44, for the input of signals to be amplified. The signal to be amplified is e.g. an analogue signal as indicated by the sine wave in the signal sources 42,44. The signal to be amplified is fed to comparators 46, to be compared with a comparison waveform. The comparison waveform is fed from one or more comparison waveform generators (CWG) 40. The comparison waveform is a triangular or saw-tooth shaped signal, as indicated by the saw-tooth in the comparison waveform generators 40. The use of one or more CWGs 40, may depend on the actually used components or the actually used circuit board design. Conventional PMAs using only one CWG 40, do this only for the sake of simplicity and expense, not for the sake of electro-magnetic compatibility (EMG). The comparators 46 compare the signal with the comparison waveform and switch the output of the comparators 46 between a "high" state and a "low". For example if the actual signal voltage is higher than the actual voltage of the comparison waveform the signal is "high", and otherwise "low". For a detailed description see e.g. FIG. 5. The output of the comparators 46 is a pulse width modulated digital signal as indicated by the digital pulse line at the output of the comparators 46. The signal is then amplified by power amplifiers 45. Two different embodiments of modulator/power amplifier combinations are depicted in the figures 2*a* and 2*b*. After the amplification indicated by the higher digital pulse line the signal is low pass filtered by the low pass filter constituted by the coil 56 and the capacitor 50, converting the amplified digital signal back to an amplified analogue signal. The analogue signal is then transferred to loudspeakers 60 and 62, to be converted into an audible sound signal. Basically, state of the art multi-channel amplifiers are single channel amplifiers connected in parallel.

Figure 2A:
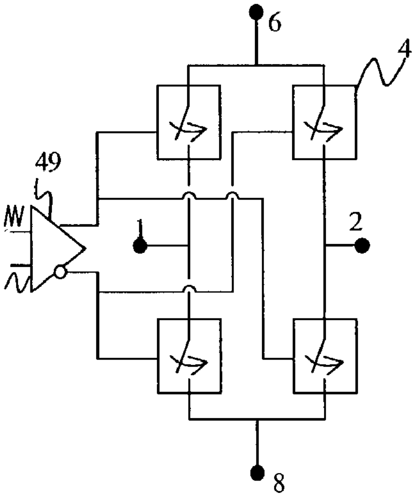
Fig. 2a (Prior Art)
FIGS. 2*a* and 2*b* are block diagrams of embodiments of conventional pulse width modulation amplifier stages.
Figure 2B:
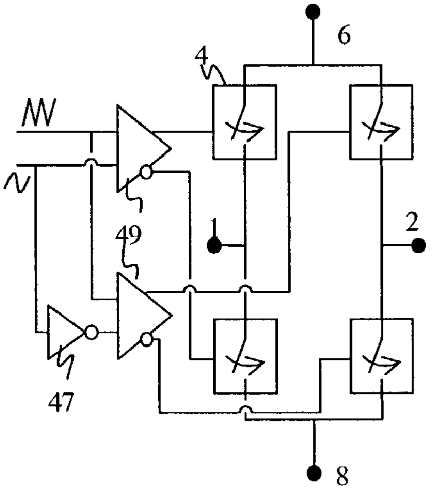
Fig. 2b (Prior Art)

FIGS. 2*a* and 2*b* are block diagrams of embodiments of conventional pulse width modulation amplifier stages. FIG. 2*a* depicts a single "Class AD" H-bridge, and FIG. 2*b* "Class BD" H-bridge for modulating and amplifying an input signal. The central element of implementations is a comparator or differential operational amplifier (op-amp) 49 with a normal and an inverted output. In FIG. 2*a* the op-amp 49 is connected with one input to an analogue signal and with the other input to a comparison waveform. Whenever the current voltage of the analogue is higher than the voltage of the comparison waveform the, voltage of the normal output is set high and the voltage of the inverted output is set low, and vice versa. The output of the op-amp 49 is connected to the H-Bridge constituted by four electrically driven switches 4 alternately connecting the supply voltage terminals 6 with voltage VCC and supply terminal 8 with supply voltage Vcc to the output terminals 1 and 2. The supply voltage terminals 6 and 7 can be connected to e.g. a positive or negative supply voltage, or e.g. ground. The electrically driven switches 4 are used to clarify that the power stage is just operating in a closed or open state and not in a resistive mode as conventional amplifiers. FIG. 2*a* depicts a "Class AD" H-bridge, operating said outputs just between two different voltage levels: VCC 6 andVcc 8.

FIG. 2*b* depict a "Class BD" H-bridge, operating the same four electrically operated switches 4 with the difference that the switches are not directly operated with a single signal, but with a combination of signals, the input signal as in the case of the "Class AD" H-bridge, the inverted input signal, inverted by the inverter 47 and a comparison waveform. The comparison waveform and the signals are selected so that the two electrically operated switches 4 connected to a single output terminal 1 or 2 are not closed at the same time. The difference of the "Class BD" H-bridge to the "Class AD" H-bridge is that both switches can be open, so that the output terminal can have the voltage states VCC 6, Vcc 8, and "Floating". Preferably, the floating voltage is directly between VCC 6 and Vcc 8, and is preferably zero volt or ground (GND). So the output of the "Class BD" H-bridge is a three state pulse width modulated signal. The main advantage of the FIG. 2*b* is that this embodiment is free of odd harmonics in the output spectrum. FIGS. 2*a* and 2*b* are only for the sake of clarity, to show that the PWM is not operating in a resistive mode.

Figure 3:
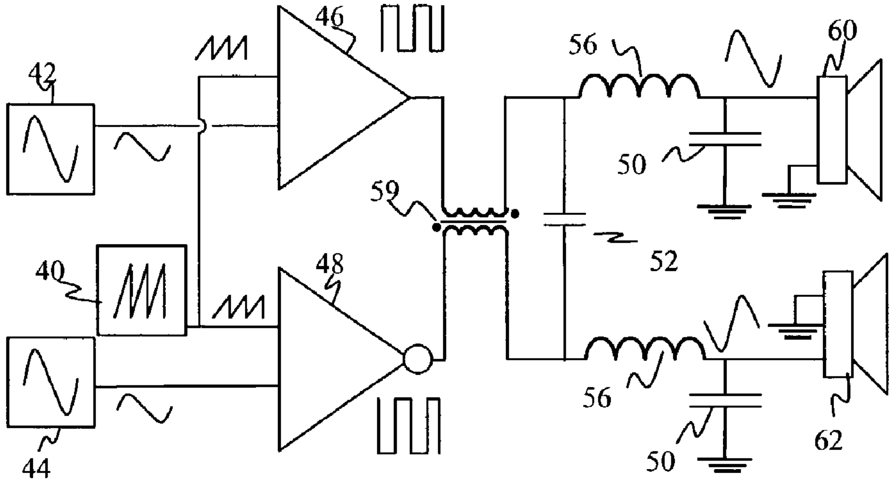
FIGS. 3 and 4 are examples of two different embodiment of two channel PMAs according to two embodiments of the present invention.
Figure 4:
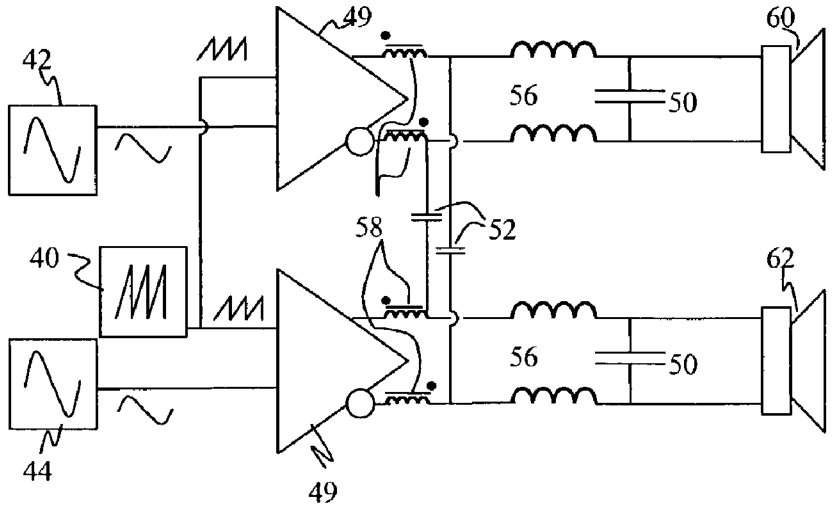

FIGS. 3 and 4 are examples of two different embodiments of two channel PMAs according to two different embodiments of the present invention. In FIG. 3 a single terminal amplifier is depicted, with each channel working against ground. Similar to FIG. 1 the input of the comparators or op-amps 46 and 48 are connected to signal sources 42,44 and reference waveform generator 40 respectively. In difference to FIG. 1 the op-amp 48 is an inverting op-amp. The output of the op-amp 46 is between +Vcc and ground (Gnd) and the output of the op-amp 48 is between −Vcc and Gnd. The output of the op-amps 46 and 48 is shorted for high frequencies by a band-pass constituted by the differential mode inductor 59 and the capacitor 52. The differential mode inductor is one example for the possibility to summarize the error with an inductive or a transformer coupling, and subsequently the signals are summed with an electrical coupling. Any other embodiment for transformer coupling may also be utilized. The summing means is adapted to sum the frequency and the harmonics of the modulation (comparison) waveform.

The summing means can be embodied as a filter, or can be replaced e.g. by a high pass filter shorting the comparison waveform frequency and the harmonics of the comparison waveform. This high frequency short circuit in combination with the synchronized input of the comparison waveform leads to synchronized pulses in the output of the op-amps 46 and 48. The inverted and synchronized output of op-amp 48 also has inverted signal edges compared to the output of op-amp 46. Therefore, the interference induced by the pulse modulation is a mirror image of the interference of the not inverted channel, so by high frequency adding of the inverted and not inverted channel the interference should even each other out. With this simple embodiment, the interference in both channels are evening each other out, and the harmonics of the comparison waveform would also even each other out. The filter between the inverted and the non inverted channel is only for the high frequency components of the output signal, and can be designed to filter only the harmonic interference. As in FIG. 1, there is are low-pass filters constituted by the capacitors 50 and the coils 56 for both channels to demodulate the PWM signals back to an analogue signal, to be transferred to the loudspeakers 60 and 62. The inverted signal also changes the polarity of the inverted channel which can be fixed simply by changing positive and negative terminals of the loudspeaker 62, as indicated by the upper terminal connected to Gnd.

Instead of the depicted series resonance oscillating circuit filter the opposite phase signals from different channels can be summed by a differential mode inductor. The differential mode inductor causes high series impedance for differential mode EMI. In the output side of the differential mode inductor the differential mode EMI can be short-circuited with a capacitor with the effect that most of the EMI is cancelled out.

The embodiment of FIG. 4 is basically the same as in FIG. 3, with the difference that the comparators of op-amps 49 provide a differential output for each channel. The op-amps 49 are synchronized as they use the same comparison waveform from the comparison waveform generator 40 to modulate the signal from the signal sources 42,44. The filter devices are connected crosswise with the filter element so that the inverted signal output of one op-amp 49 is connected to the not inverted output of the other channel. The filter devices comprise the capacitors 52 and the coils 58, and are embodied as symmetric low pass filters for the signal. In the block diagram, the low pass filter for demodulating the pulse width modulated signal, comprises the capacitors 50 and the coils 56. As in FIG. 3, the loudspeakers 60,62 are substantially the same as in the FIGS. 1 and 3. It is to be noted that the differential mode inductor and the low pass filters of FIGS. 3 and 4 may be combined with each other or e.g. with a serial oscillatory circuit. A serial oscillatory circuit is a serial combination of a capacitor with at least one impedance.

Figure 5:
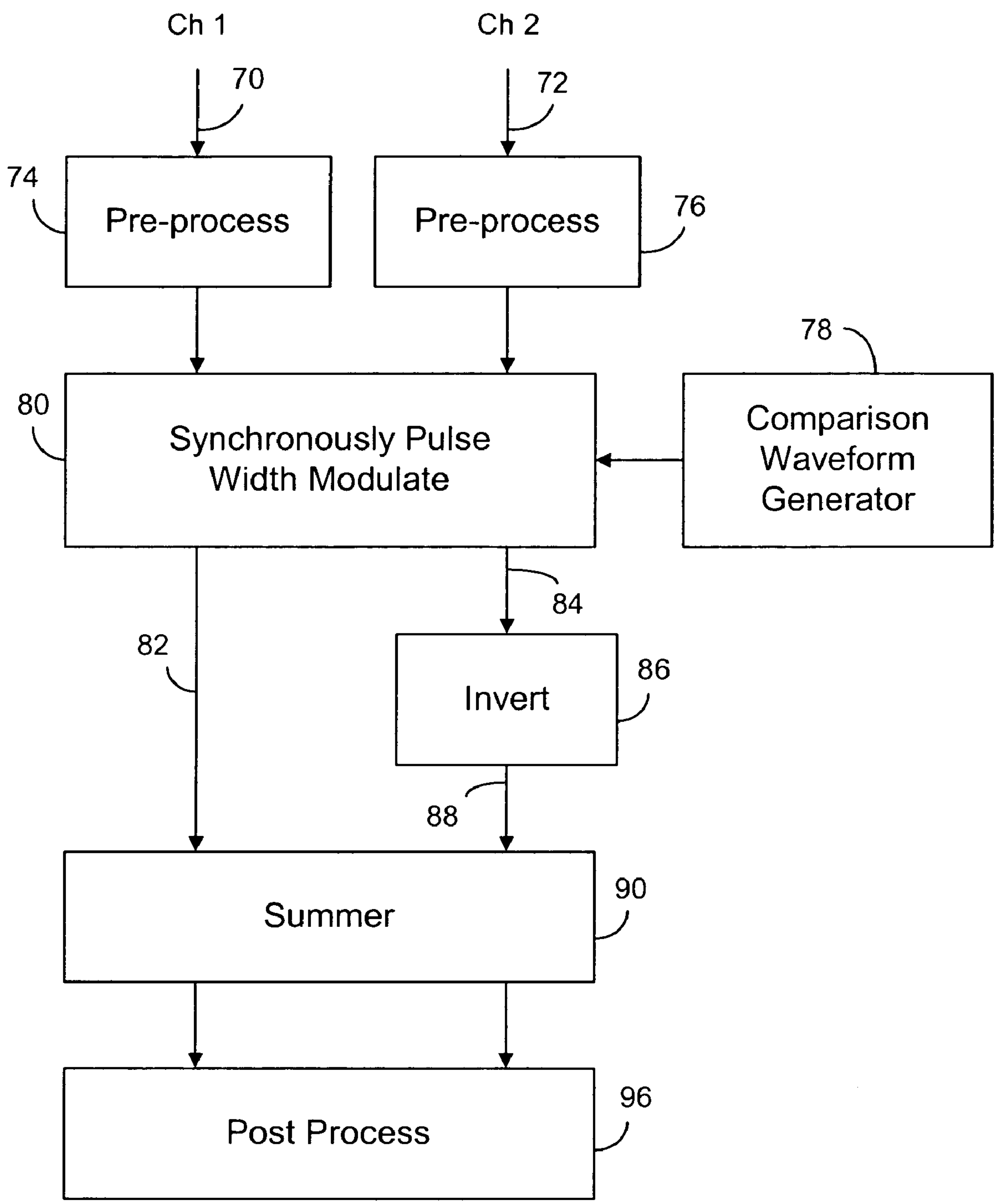
FIG. 5 is a flowchart of the method for operation a PMA according to an embodiment of the present invention.

FIG. 5 depicts a flowchart of a method for operating a PMA according to an embodiment of the present invention. The flowchart starts with receiving signals of two channels 70 and 72. The input signals are pre-processed in the steps 74 and 76. The received signals can be e.g. analogue signals, or any other signals e.g. pulse code modulated or e.g. data signals from a compact disc or a the data from a MPG-3 data source. The signals or data signals are synchronously pulse width modulated in step 80. In the case of analogue input signals, the pulse width modulation can be executed e.g. by a comparators or differential op-amps operated with synchronized comparison waveform from a comparison waveform generator 78. In the case of e.g. coded data signals, a the synchronization signal may be extracted from a data stream itself. In the case of a determined synchronization with a determined pulse frequency, the summing means can be optimized. The important point in step 80 is that the modulation output pulses are synchronized. Both signals are then outputted in the steps 82 (e.g. channel 1) and 84 (e.g. channel 2). The signal of channel 2 is then inverted in step 86 e.g. by an inverter or the like. The inverting step should not destroy the synchronization of the pules in both channels. To prevent a de-synchronization, e.g. the non inverted channel may be delayed. Preferably, inversion of the channel (Ch) 2 is executed during the modulation step 80. The not inverted signal 82 of Ch1 and the inverted signal of Ch2 88 are then transferred to a summing means and are inductively summed 90 by a differential mode inductor, combined with a capacitor, or any other low-pass filter or high pass shorting device. Finally, both signals can be post processed in step 96, by demodulation, or the like.

Figure 6:
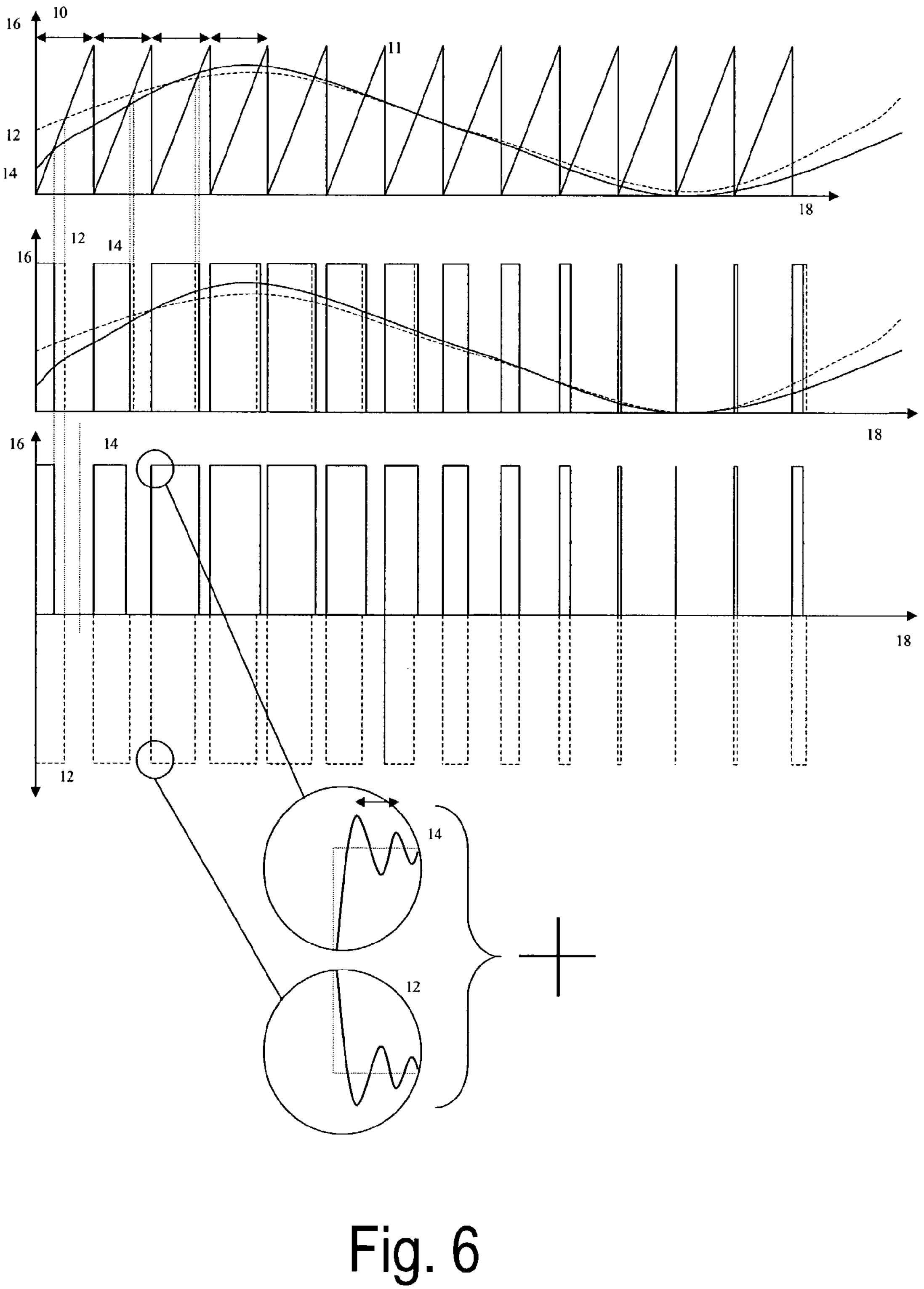
FIG. 6 is an example of the signals in the different stages of the PMA.

FIG. 6 is an example of the signals in the different stages of the PMA. In the diagram the vertical axis 16 is a voltage scale and the horizontal axis 18 is time scale. In the first diagram on top it is depicted the sine like signal of channel 1 as the continuous sine function referred to with the reference numeral 14, and the broken sine like line with the reference numeral 12 is the signal of channel 2. As in the case of stereo signals, the signals are only slightly different from each other. In the top diagram there is also a saw-tooth function 11 depicted used as comparison waveform. The double arrows 10 in the top diagram indicate the period of one oscillation of the comparison waveform. The points of intersection of the signals 12,14 and the comparison waveform indicate the switching points of the op-amps for each channel. As the Op amps use the same comparison waveform for both channels, the pulses of both channels start at the same time. In the diagram below, both signals 12,14 and their pulse width modulations are depicted. In the third diagram from above the signal 14 is the same as in the diagram in the middle and varies between +Vcc and Gnd. The signal 12 is inverted and varies between −Vcc and Gnd. As can be seen from the diagram the start of the pulses in both channels are synchronized. Below the third diagram there are depicted enlarged details of the pulses of signal 12 and 14. In the enlarged details, there is an indication of an ideal pulse form and an expected pulse form with a characteristic distortion. The small double arrow on top of the characteristic distortion of signal 14 indicates the period length of electric interference in the system.

The summing means should be adapted to sum said high frequency interference. In order to reduce common mode components half of the output channels are inverted, which requires an even number of channels as e.g. in the case of stereo. The inversion also changes the polarity of the inverted channel, which can be fixed simply by changing positive and negative terminals. Because music (etc. audio) signals contain mainly the same components in all channels with only small differences between the channels, there are very similar signals in each channel. Therefore most of the time there are pairs of signals with opposite phase between inverted and non-inverted signals. These pairs contain differential mode energy, which is easier to filter out. The idea is to convert a common mode interference to a differential mode interference which can be filtered out easily.

Figure 7:
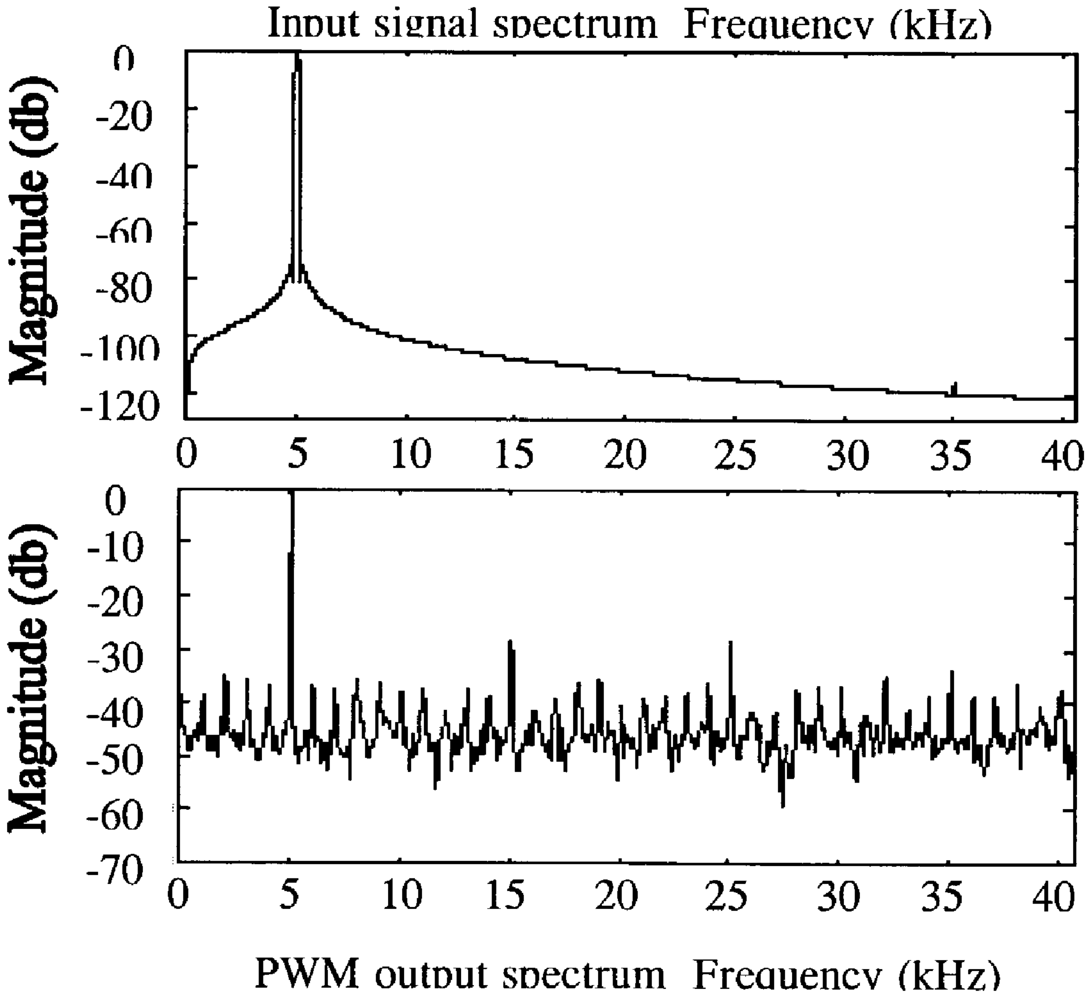
FIG. 7 is an example of the input signal spectrum and the PWM output spectrum of a conventional PMA.

FIG. 7 is an example of the input signal spectrum and the PWM output spectrum of a conventional PMA. The top diagram depicts the input spectrum of an analogue signal for one channel, wherein the vertical axis is the signal magnitude in decibel (dB) and the horizontal axis is the frequency in kHz. The signal has maximum magnitude with 0 dB at 5 kHz. The other frequencies have a magnitude between −80 to −120 dB. In the frequency range the between 0 and 5 kHz and in the frequency range between 5 and 40 kHz the signals are substantially monotonously rising and falling respectively.

The output spectrum of a pulse width modulator has substantially the same maximum at 5 kHz, but the frequency distribution of the range from 0 to 5 and from 5 to 40 kHz is nearly equally noisy, with a magnitude between −30 dB to −70 dB. In the output spectrum the harmonics of the input signal maximum (5 kHz) can be seen at 15, 25, and 35 kHz. The other noise and interference elements in the spectrum are caused by the keying of the pulse width modulator. When the modulators of different channels are synchronized, the phase of noise components is the same with high probability. Audio signals used, e.g. in stereo signals, have substantially the same depth of modulation in both (stereo) channels. Therefore, it should be possible to subtract the noise components of same phase from each others.

For the sake of clarity, in the figures only PWM-embodiments of the present inventions are depicted, but it is to be noted that the kind of modulation used is not important for the present invention. The basic idea of the invention is, if substantially similar input signals of different channels are modulated substantially similarly, that the high frequency interference occurring in both channels would be substantially the same, and therefore would be easily summed out or filtered out differentially. The modulation can be e.g. amplitude modulation (AM), frequency modulation (FM), click modulation in a digital pulse modulation amplifier (DPMA), pulse width modulation (PWM), phase shift modulation (PSM), or any other modulation type generating high frequency error energy. The different modulation types can be used alone or in combination with others for each channel. The modulation can be of analogue form, digitally (two level) modulation or of a hybrid type (three- or more level) modulation. The invention can be applied in every case, when the modulation of different channels produce synchronous, same phase, not wanted signals which can be subtracted from each other.

This application contains the description of implementations and embodiments of the present invention with the help of examples. It will be appreciated by a person skilled in the art that the present invention is not restricted to details of the embodiments presented above, and that the invention can also be implemented in another form without deviating from the characteristics of the invention. The embodiments presented above should be considered illustrative, but not restricting. Thus the possibilities of implementing and using the invention are only restricted by the enclosed claims. Consequently various options of implementing the invention as determined by the claims, including equivalent implementations, also belong to the scope of the invention.

The invention claimed is:

1. A method comprising:

pulse width modulating at least one group of at least two substantially similar audio output signals, representing different channels of a multi-channel audio signal wherein said modulating generates high frequency error components, directly inverting half of said pulse width modulated signals, summing said inverted and said non inverted signals representing different channels in said group to reduce the high frequency error components.

2. A method according to claim 1, wherein said summing is executed by inductive summing.

3. A method according to claim 1, wherein said summing is executed by capacitive summing.

4. A method according to claim 1, wherein said group comprises at least one pair of left and right signals of a stereo audio signal.

5. A method according to claim 1, wherein said group comprises the signals of a multi-channel surround audio signal.

6. A method according to claim 1, further comprising synchronizing said modulated signals.

7. A method according to claim 6, wherein said synchronization is executed by synchronous modulation.

8. A method according to claim 6, wherein the method further comprises pre-processing of said at least one group of substantially similar signals, prior to said step of synchronizing.

9. A method according to claim 1, further comprising amplifying said modulated signals.

10. A method according to claim 1, further comprising demodulating said inverted and non-inverted output signals.

11. A multi-channel modulator in a portable device comprising:

at least two channels for audio signals having at least one group of substantially similar audio signals representing different channels of a multi-channel audio signal, an amplifier for each audio signal of each group of substantially similar audio signals, each amplifier combining the audio signal of each channel with a reference waveform so as to generate a pulse width modulated signal based on a comparison of said audio signal with said reference waveform, an inverter, and a summer, said channels each having at least one input terminal, and at least one output terminal, said inverter being directly linked to at least one, but less than or equal to half of said channels, and said summer being connected between said output terminals of said channels and thereby configured for reducing high frequency error components of said group of substantially similar signals.

12. A multi-channel modulator according to claim 11, wherein said at least two channels comprise at least one pair of left and right channels of a stereo audio system.

13. A multi-channel modulator according to claim 11, wherein said at least two channels comprise the channels of a multi-channel surround audio system.

14. A multi-channel modulator according to claim 11, wherein each amplifier for each audio signal of each group of substantially similar audio signals is configured to synchronize each generated pulse width modulated signal with respect to each other generated pulse width modulated signal.

15. A multi-channel modulator according to claim 11, wherein at least one inverter is connected to at least one of said output terminals and said signal input terminals.

16. A multi-channel modulator according to claim 11, further comprising a modulation waveform generator for generating said reference waveform.

17. A multi-channel modulator according to claim 11, wherein said summer comprises at least one element selected from the group comprising coils, differential mode inductors, and capacitors.

18. A multi-channel modulator according to claim 11, further comprising at least one power amplifier.

19. A multi-channel modulator according to claim 11, further comprising at least one pre- and/or post-processing stage.

20. A portable multi-channel electronic device having a built-in multi-channel modulator as claimed in claim 11.

21. A portable multi-channel electronic device according to claim 20, further comprising headphones.

22. A multi-channel modulator in a portable device comprising:

at least two channels for audio signals having at least one group of substantially similar audio signals representing different channels of a multi-channel audio signal, an amplifier for each audio signal of each group of substantially similar audio signals, each amplifier combining the audio signal of each channel with a reference waveform so as to generate a pulse width modulated signal based on a comparison of said audio signal with said reference waveform, means for inverting, and means for summing, said channels each having at least one input terminal, and at least one output terminal, said means for inverting being directly linked to at least one, but less than or equal to half of said channels, and said means for summing being connected between said output terminals of said channels and thereby configured for reducing high frequency error components of said group of substantially similar signals.

23. A multi-channel modulator according to claim 22, wherein each amplifier for each audio signal of each group of substantially similar audio signals is configured to synchronize each generated pulse width modulated signals with respect to each other generated pulse width modulated signal.

* * * * *